(12) United States Patent
Kim et al.

(10) Patent No.: US 7,050,334 B2
(45) Date of Patent: May 23, 2006

(54) FLASH MEMORY PROGRAM CONTROL CIRCUIT AND METHOD FOR CONTROLLING BIT LINE VOLTAGE LEVEL DURING PROGRAMMING OPERATIONS

(75) Inventors: Tae-Seong Kim, Yongin-si (KR); Myoung-Kyu Seo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 10/921,798

(22) Filed: Aug. 20, 2004

(65) Prior Publication Data

US 2005/0047214 A1 Mar. 3, 2005

(30) Foreign Application Priority Data

Aug. 26, 2003 (KR) .................. 10-2003-0059102

(51) Int. Cl.
*G11C 16/00* (2006.01)

(52) U.S. Cl. ............................. 365/185.28; 365/185.23
(58) Field of Classification Search .................... None
See application file for complete search history.

(56) References Cited

U.S. PATENT DOCUMENTS 6,014,331 A   1/2000 Chih
6,026,024 A * 2/2000 Odani et al. ........... 365/185.22
6,038,174 A * 3/2000 Khan et al. ............ 365/185.28
6,104,637 A * 8/2000 Seo ....................... 365/185.24
6,141,253 A * 10/2000 Lin ........................ 365/185.28

* cited by examiner

*Primary Examiner*—Tan T. Nguyen
(74) *Attorney, Agent, or Firm*—Harness, Dickey & Pierce, P.L.C.

(57) ABSTRACT

Provided are a program control circuit for flash memory devices and a control method utilizing such a circuit for controlling the bit line voltage level during programming operations for flash memory devices that include memory cells arranged in the form of a matrix, in which each of the memory cells is connected to a word line, a bit line, and a source line and which provides a program current to the bit line. The program control circuit includes a voltage level sensing control portion, a switching control portion, a current sink and a switching circuit. The voltage level sensing control portion is enabled or disabled in response to a first program control signal and compares the voltage of a bit line connected to a memory cell being programmed with a reference voltage and outputs a voltage control signal corresponding to the result of the comparison. The switching control portion outputs a switching bias signal in response to the voltage control signal and a second program control signal. The current sink provides a predetermined current to a ground voltage in response to a reference bias signal. The switching circuit, which is connected between the bit line and the current sink, is turned on or off in response to the switching bias signal.

15 Claims, 4 Drawing Sheets

FLASH MEMORY PROGRAM CONTROL CIRCUIT AND METHOD FOR CONTROLLING BIT LINE VOLTAGE LEVEL DURING PROGRAMMING OPERATIONS

CROSS REFERENCE TO RELATED APPLICATION

This application claims priority from Korean Patent Application No. 2003-59102, which was filed on Aug. 26, 2003, in the Korean Intellectual Property Office, the disclosure of which is hereby incorporated by reference in its entirety.

BACKGROUND OF THE INVENTION

1. Field of the Invention

The present invention relates to flash memory devices, and more particularly, to a program control circuit for flash memory devices and a program control method performed using such program control circuits.

2. Description of the Related Art

In general, flash memory devices perform a read operation, a programming operation and an erase operation. The programming operation of the flash memory devices is performed through hot electron injection. The erase operation of the flash memory devices is performed through Fowler-Nordheim (FN) tunneling that occurs between a source electrode of a memory cell and a floating gate of the memory cell.

Flash memory devices perform these three operations as a result in changes in the magnitude of bias voltage(s) applied to a memory cell. In particular, during the programming operation of a conventional split-gate-type flash memory device, a program current flows between a source and drain of the memory cell that is being programmed. This is because the programming operation is performed by injecting a hot carrier generated from the source of the memory cell onto a floating gate of the memory cell. U.S. Pat. No. 6,014,331 discloses an exemplary circuit for programming a conventional split-gate-type flash memory cell and is hereby incorporated, in its entirety, by reference.

Conventional split-gate-type flash memories include memory cells arranged in an row-and-column array structure, as illustrated in FIG. 1 which provides a block diagram of a small portion of a conventional split-gate-type flash memory cell array. As illustrated in FIG. 1, memory cells C00–C02 share a word line WL0 and memory cells C10–C12 share a word line WL1 and all six memory cells C00–C02 and C10–C12 share a common source line SL0. Further, the memory cells C00 and C10 share a bit line BL0, the memory cells C01 and C11 share a bit line BL1, and the memory cells C02 and C12 share a bit line BL2.

FIG. 2 is a cross-sectional view of a conventional split-gate-type flash memory cell. As shown in FIG. 2, a split-gate-type flash memory cell 10 includes a substrate 11, a source 12, a drain 13, a floating gate 14, and a control gate 15. The programming operation of the split-gate-type flash memory cell 10 is performed by injecting hot carriers generated from the source 12 onto the floating gate 14 through a channel 17 and an insulating layer 16.

Hereinafter, a program control circuit of a flash memory device according to conventional art will be described with reference to FIG. 3. In memory cell C10 of FIG. 3, the gate is connected to a word line WL1, the drain is connected to a bit line BL0, and the source is connected to a source line SL0. The memory cell C10 also shares the source line SL0 and the bit line BL0 with a memory cell C00.

A program control circuit 20 is connected to the bit line BL0 that is, in turn, connected to the drain of the memory cell C10 that is to be programmed. The program control circuit 20 includes a first switching control portion 21, a first switching circuit N1, an inverter 22, a second switching control portion 23, a second switching circuit 24, and a current sink N3. When the memory cell C10 is programmed, the first switching circuit N1 and the second switching circuit 24 are turned on and different bias voltages are applied to the word line WL1, the bit line BL0, and the source line SL0. For example during a programming operation for memory cell C10, a high bias voltage of 4V may be applied to the word line WL1, a bias voltage of 0.8V may be applied to the bit line BL0, and a bias voltage of 4.5V may be applied to the source line SL0. Simultaneously, a voltage of 0V may be applied to word line WL0, which is connected to the gate of the memory cell C00 that is not being programmed. Also, although not indicated in FIG. 3, a high bias voltage, e.g., a bias voltage of 5V, may also be applied to the bit lines BL1 and BL2.

When the memory cell C10 is programmed, the bias voltage of 4V is applied to the word line WL1 and the memory cell C10 is turned on, allowing a program current Ip to flow between the source and drain of the memory cell C10. As the programming operation progresses, a threshold voltage of the gate of the memory cell C10 will tend to increase. As a result, the ability of the program current Ip to flow between the source (12 of FIG. 2) and drain (13 of FIG. 2) of the memory cell C10 using only the bias voltage (VG of FIG. 2) applied to the gate of the memory cell C10 will tend to be reduced or eliminated.

More specifically, the amount of time required to complete the programming operation will tend to vary with characteristics of memory cells to be programmed. As a result, a programming operation of specific duration may result in the over-programming of some memory cells. As a result of the over-programming, some of electrons injected during the programming operation may tend to remain in the floating gate (14 of FIG. 2) of a memory cell even after an erase operation has been completed.

This phenomenon is greatly affected by the number of programming operations performed on a memory cell and the characteristics of the particular memory cell. In other words, when the programming operation has a duration in excess of that required to fully program a particular memory cell, that the memory cell will tend to become over-programmed. Conversely, when the erase operation is of insufficient duration to remove the necessary number of electrons, some of electrons injected onto the floating gate of the memory cell during the programming operation may tend to remain in the floating gate of the memory cell.

For example, assuming that some of electrons are not discharged, but remain in the floating gate of the memory cell C10, when the memory cell C10 is programmed again, additional electrons are injected onto the floating gate of the memory cell C10 again. As a result, memory cell C10 will tend to contain more than the desired number of electrons in its the floating gate.

Further, during the programming operation, it is desirable to inject electrons onto the floating gate of the memory cell C10 in such a way that the flow of the program current Ip is generally maintained for the duration of the operation. However, when too many electrons are present in the floating gate of the memory cell C10, the program current Ip will tend to be reduced or interrupted. As a result, the desired program current Ip would no longer be supplied to the bit line BL0. As a result of this interruption, the first switching circuit N1 and the second switching circuit 24 are being turned on, the voltage level of the bit line BL0 becomes 0V through operation of the current sink N3.

As a result, punch through may occurs in memory cell C00 that shares bit line BL0 and source line SL0 with the memory cell C10 being programmed. As used herein, punch through indicates that current begins to flow between the source and drain of the memory cell C00 even when the memory cell C00 is turned off. Punch through occurs because the memory cell C00 that is not being programmed shares source line SL0 and bit line BL0 with the memory cell C10.

When the voltage level of the bit line BL0 connected to the drain of the memory cell C00 becomes 0V, a relatively high bias voltage (e.g., 4.5V) is applied to the source line SL0. As a result, although the memory cell C00 is not turned on, a current flows between the source and drain of the memory cell C00 due to the large voltage difference created between the source and drain. Such punch through tends to degrade the performance of a memory cell and shorten the operational life span of a memory cell.

Also, when the voltage level of the bit line BL0 becomes 0V, there is a high probability that the memory cell C10 is over programmed. This is because electrons are continuously injected onto the floating gate of the memory cell C10 from the source of the memory cell C10, even when the program current Ip is no longer supplied to the bit line BL0. Accordingly, it is necessary to control a variable voltage level of a bit line within a predetermined scope in a programming operation.

SUMMARY OF THE INVENTION

The present invention provides a program control circuit for flash memory devices for controlling the voltage level of a bit line that varies during a programming operation and a program control method performed in the program control circuit.

An exemplary embodiment of the present invention provides a program control circuit for flash memory devices that utilize memory cells arranged in the form of a matrix in which each of the memory cells is connected to a word line, a bit line and a source line and in which a program current is supplied to the bit line. The exemplary program control circuit includes a level sensing control portion, a switching control portion, a current sink, and a switching circuit. The level sensing control portion is enabled or disabled in response to a first program control signal, compares a voltage (hereinafter, referred to as a bit line voltage) of a bit line that is connected to a memory cell to be programmed with a reference voltage, and outputs a voltage control signal based on the result of the comparison. The switching control portion outputs a switching bias signal in response to the voltage control signal and a second program control signal. The current sink provides a predetermined current to a ground voltage in response to a reference bias signal. The switching circuit is connected between the bit line and the current sink and is turned on or off in response to the switching bias signal.

Another exemplary embodiment of the present invention provides a program control method for flash memory devices that utilize memory cells arranged in the form of a matrix, each of which is connected to a word line, a bit line, and a source line and which supplies a program current to the bit line. The program control method includes enabling a program control signal, turning on a switching circuit connected to a bit line of a memory cell to be programmed, in response to the program control signal, outputting a voltage control signal in response to the program control signal and a voltage of the bit line, controlling a voltage level of the bit line by turning the switching circuit on or off in response to the voltage control signal, and terminating the programming operation with respect to the selected memory cell when the program control signal is disabled.

BRIEF DESCRIPTION OF THE DRAWINGS

The above and other aspects and advantages of the present invention will become more apparent in the following detailed descriptions of exemplary embodiments thereof with reference to the attached drawings in which.

DETAILED DESCRIPTION OF THE INVENTION

Figure 1:
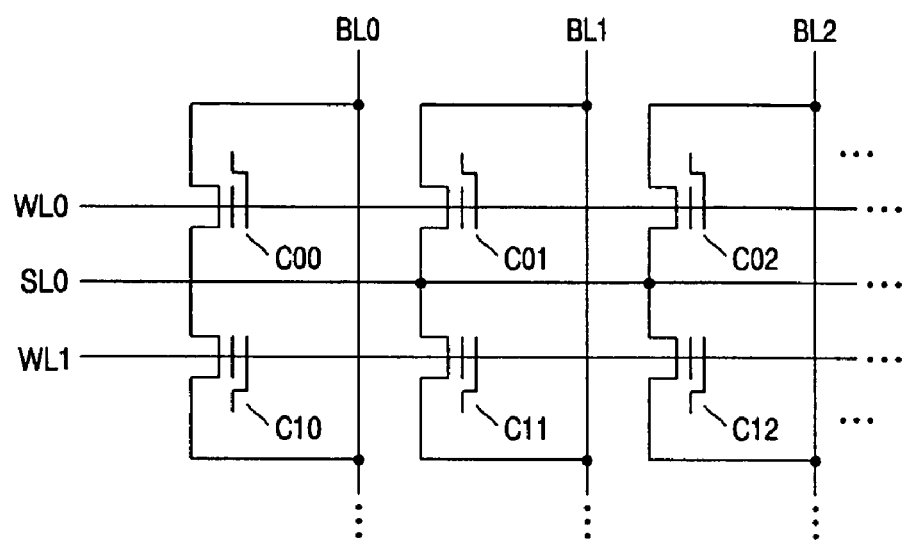
FIG. 1 is a circuit diagram of a part of a conventional split-gate-type flash memory cell array.
Figure 2:
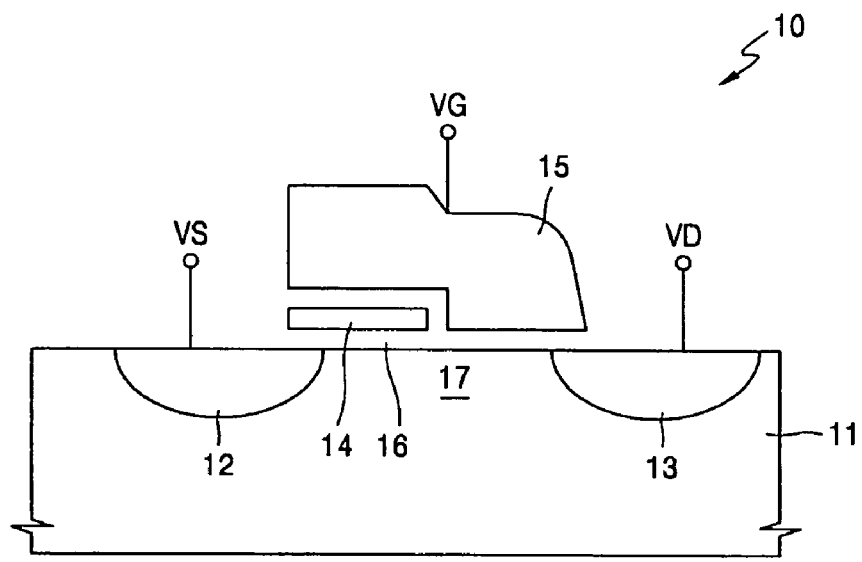
FIG. 2 is a sectional view of a conventional split-gate-type flash memory cell.
Figure 3:
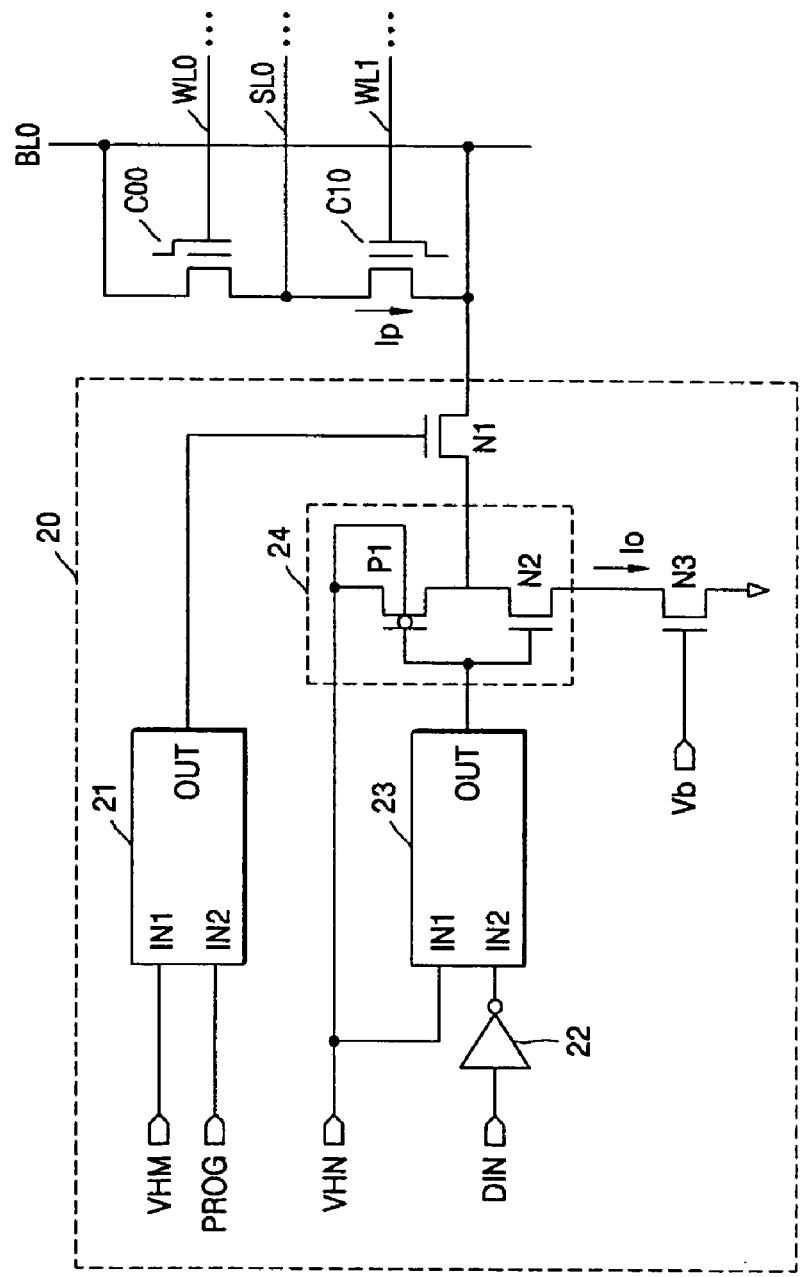
FIG. 3 illustrates a program control circuit and a part of a conventional split-gate-type flash memory cell array.

The present invention will now be described more fully with reference to the accompanying drawings, in which a preferred embodiment of the invention is shown. In the drawings, like reference numerals are used to identify identical, corresponding or similar elements throughout.

Figure 4:
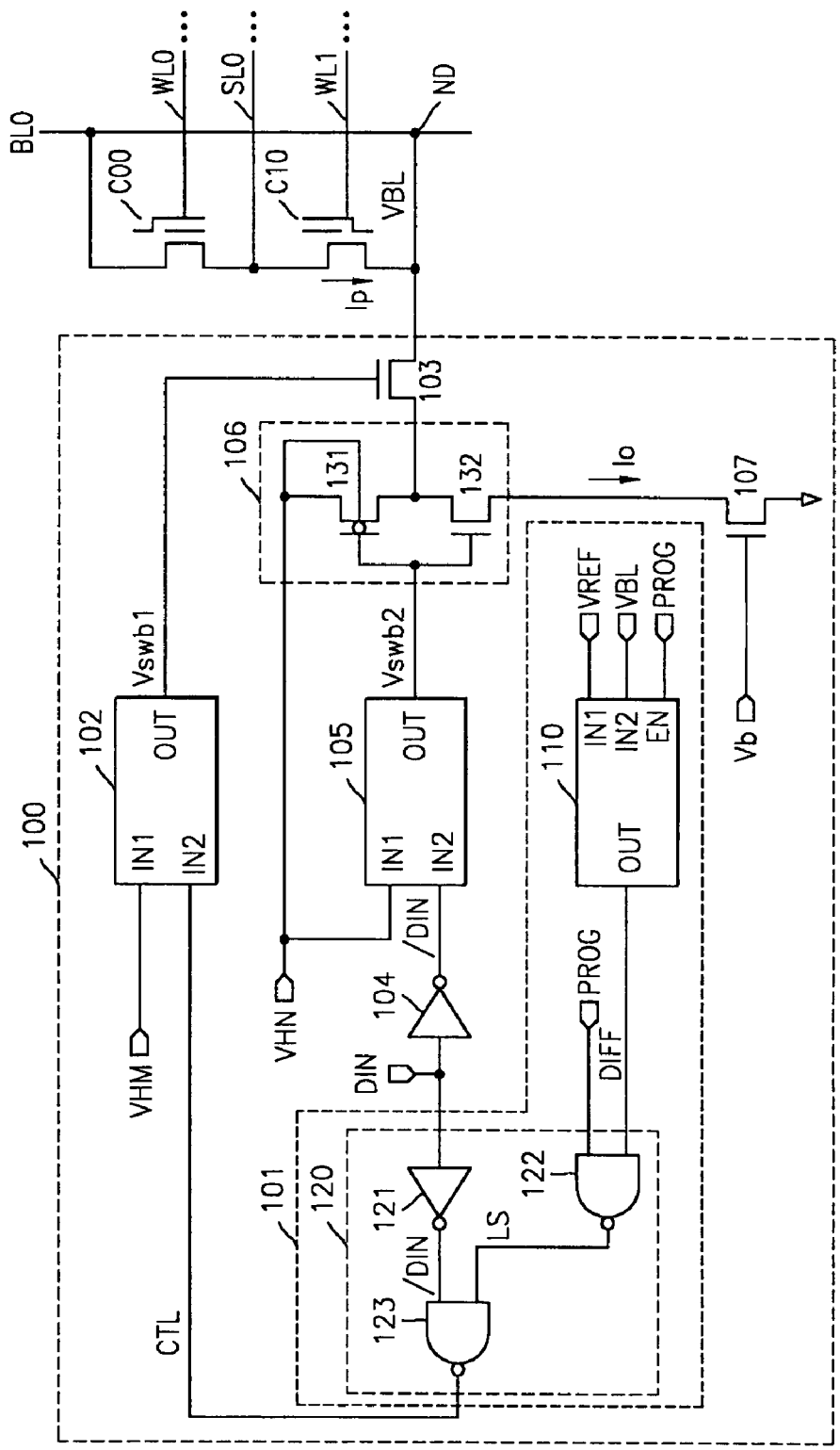
FIG. 4 illustrates a program control circuit and a part of split-gate-type flash memory cell array, according to an exemplary embodiment of the present invention.

FIG. 4 illustrates an exemplary program control circuit 100 and a representative portion of split-gate-type flash memory cell array, according to an exemplary embodiment of the present invention. As illustrated in FIG. 4, the gate of a memory cell C10 is connected to a word line WL1, the drain of the memory cell C10 is connected to a bit line BL0, and the source of the memory cell C10 is connected to a source line SL0. The memory cell C10 shares the source line SL0 and the bit line BL0 with a memory cell C00 with the gate of the memory cell C00 being connected to a word line WL0.

The program control circuit 100 is connected to a bit line that is connected to the drain of a memory cell that is to be programmed. For the purposes of the following description, it will be assumed that memory cell C10 of FIG. 4 is the memory cell has been selected to be programmed with the program control circuit 100 being connected to the bit line BL0.

The program control circuit 100 includes a level sensing control portion 101, a first switching control portion 102, a first switching circuit 103, an inverter 104, a second switching control portion 105, a second switching circuit 106, and a current sink 107.

The level sensing control portion 101 compares a voltage VBL of the bit line BL0, which is output from a node ND, with a reference voltage VREF and outputs a voltage control signal CTL based on the result of the comparison.

The level sensing control portion 101 includes a comparing portion 110 and a logic circuit 120. The comparing portion 110 is enabled or disabled in response to a first program control signal PROG. Once the comparing portion 110 is enabled, it compares the voltage VBL with the reference voltage VREF and outputs a comparison result signal DIFF. The structure of the comparing portion 110 will be described further below with reference to FIG. 5.

An exemplary logic circuit 120 outputs the voltage control signal CTL in response to the first program control signal PROG, a second program control signal DIN, and the comparison result signal DIFF. As illustrated in FIG. 4, the logic circuit 120 may be implemented by an inverter 121 and NAND gates 122 and 123. The inverter 121 inverts the second program control signal DIN and outputs an inverted second program control signal/DIN. The NAND gate 122 outputs a logic signal LS of a predetermined level in response to the first program control signal PROG and the comparison result signal DIFF. The NAND gate 123 outputs the voltage control signal CTL in response to the inverted second program control signal/DIN and the logic signal LS. As will be appreciated by those of skill in the art, the logic circuit 120 may be embodied in various circuits, each of which may outputs a voltage control signal CTL based on the state of the input signals PROG, DIFF and DIN. Also, the inverters 104 and 121 may be replaced with an inverter which inverts the second program control signal DIN and outputs the inverted second program control signal/DIN to the NAND gate 123 and the second switching control portion 105.

The first program control signal PROG enables the entire programming operations of a flash memory device, and the second program control signal DIN enables the programming operation that is to be performed on the memory cell C10.

The first switching control portion 102 receives a first high voltage VHM through a first input terminal IN1 and receives the voltage control signal CTL through a second input terminal IN2. The first switching control portion 102 outputs a first switching bias signal Vswb1 in response to the voltage control signal CTL.

To be more specific, for example, when the voltage control signal CTL is enabled, the first switching control portion 102 outputs the first high voltage VHM as the first switching bias signal Vswb1 to an output terminal OUT, at which time the first switching bias signal Vswb1 will go high. Conversely, when the voltage control signal CTL is disabled, the first switching control portion 102 does not output the first high voltage VHM to the output terminal OUT and the first switching bias signal Vswb1 will go low.

The first switching circuit 103 is turned on or off in response to the first switching bias signal Vswb1. As illustrated in FIG. 4, the first switching circuit 103 may be implemented as an NMOS transistor. Hereinafter, the first switching circuit 103 will be referred to as an NMOS transistor 103. The first switching bias signal Vswb1 is applied to the gate of the NMOS transistor 103. The drain of the NMOS transistor 103 is connected to the bit line BL0 and the source of the NMOS transistor 103 is connected to the second switching circuit 106.

The inverter 104 inverts the second program control signal DIN and outputs the inverted second program control signal/DIN. The second switching control portion 105 receives a second high voltage VHN through a first input terminal IN1 and receives the inverted second program control signal/DIN through a second input terminal IN2. The second switching control portion 105 outputs a second switching bias signal Vswb2 in response to the inverted second program control signal/DIN.

To be more specific, for example, when the inverted second program control signal/DIN is high, the second switching control portion 105 outputs the second high voltage VHN as the second switching bias signal Vswb2 to the output terminal OUT and the second switching bias signal Vswb2 will go high. Conversely, when the inverted second program control signal/DIN is low, the second switching control portion 105 does not output the second high voltage VHN to the output terminal OUT and the second switching bias signal Vswb2 will go low.

In this instance, the second high voltage VHN may be set to be lower than the first high voltage VHM.

The second switching circuit 106 is turned on or off in response to the second switching bias signal Vswb2. As illustrated in FIG. 4, the second switching circuit 106 may be implemented by a PMOS transistor 131 and an NMOS transistor 132. The second switching bias signal Vswb2 is applied to the gates of the PMOS transistor 131 and the NMOS transistor 132. The drains of the PMOS transistor 131 and the NMOS transistor 132 are, in turn, connected to the source of the NMOS transistor 103. Also, the source of the PMOS transistor 131 is connected to the second high voltage VHN and the source of the NMOS transistor 132 is connected to the current sink 107.

The current sink 107 is turned on in response to a bias voltage Vb and then provides a current Io. As illustrated in FIG. 4, the current sink 107 may be implemented as an NMOS transistor. Hereinafter, the current sink 107 will be referred to as an NMOS transistor 107. The bias voltage Vb is supplied to the gate of the NMOS transistor 107. The drain of the NMOS transistor 107 is connected to the source of the NMOS transistor 132 and the source of the NMOS transistor 107 is connected to a ground voltage.

Figure 5:
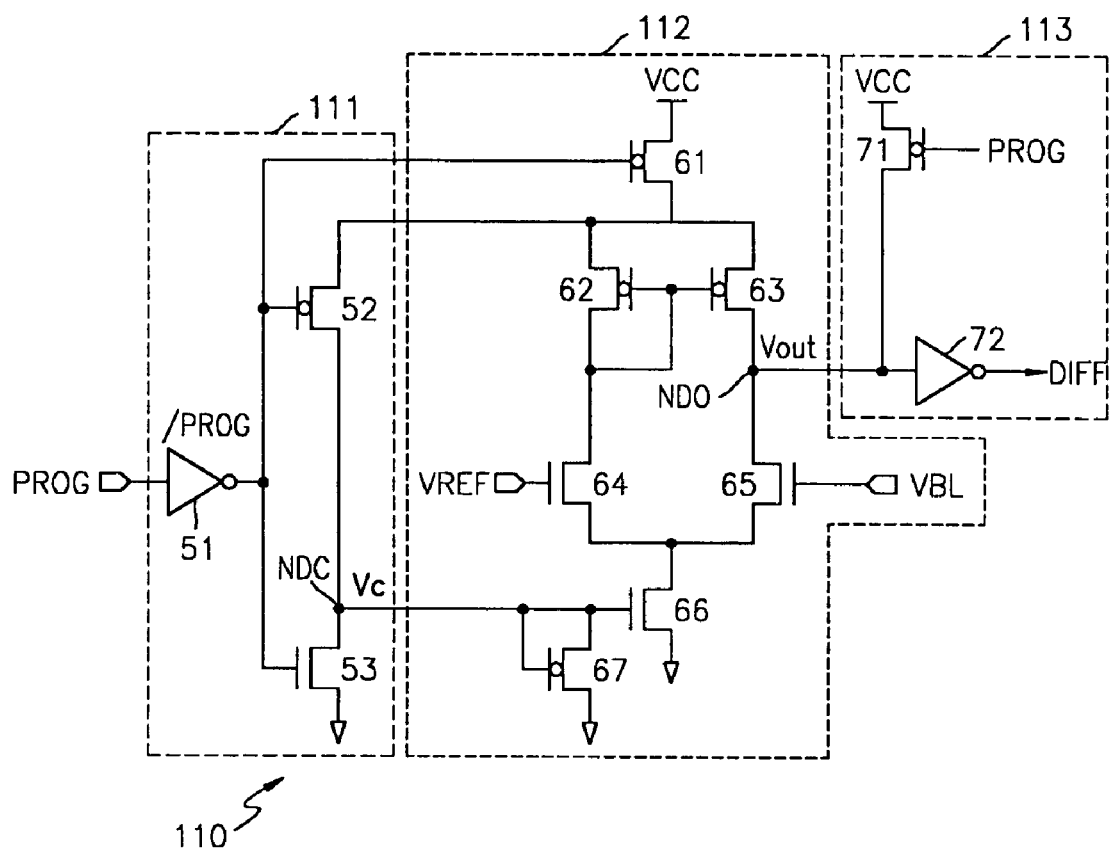
FIG. 5 is a circuit diagram showing in somewhat greater detail an exemplary comparator for including in FIG. 4 according to an exemplary embodiment of the present invention.

The structure and operation of the comparing portion 110 may be explained further with reference to FIG. 5. As illustrated in FIG. 5, the comparing portion 110 may include an enable control circuit 111, a differential amplifier 112 and an output control circuit 113.

The enable control circuit 111 enables or disables the differential amplifier 112 in response to the first program control signal PROG. The exemplary enable control circuit 111 includes an inverter 51, a PMOS transistor 52, and an NMOS transistor 53. The inverter 51 inverts the first program control signal PROG and outputs an inverted first program control signal/PROG. The inverted first program control signal/PROG is input to the gates of the PMOS transistor 52 and the NMOS transistor 53. The drains of the PMOS transistor 52 and the NMOS transistor 53 are, in turn, connected to a node NDC and the source of the NMOS transistor 53 is connected to the ground voltage.

As illustrated in FIG. 5, the differential amplifier 112 is enabled or disabled under the control of the enable control circuit 111. The exemplary differential amplifier 112 includes PMOS transistors 61–63 and 67 and NMOS transistors 64–66. The source of the PMOS transistor 61 is connected to an internal voltage VCC with the inverted first program control signal/PROG being input to the gate of the PMOS transistor 61. Also, the drain of the PMOS transistor 61, along with the sources of the PMOS transistors 62 and 63, is connected to the source of the PMOS transistor 52.

The PMOS transistors 62 and 63 form a current mirror. The NMOS transistors 64 and 65 compare the reference voltage VREF with the voltage VBL of the bit line (BL0 of FIG. 4) and output an output signal Vout as the result of the comparison to a node NDO. The NMOS transistor 66 operates as a current source. The gate of the NMOS transistor 66 is connected to the node NDC of the enable control circuit 111 and the source of the NMOS transistor 66 is connected to the ground voltage.

The PMOS transistor 67 allows an output voltage Vc output from the node NDC to be maintained at a high level or a low level. The output control circuit 113 outputs the comparison result signal DIFF in response to the first program control signal PROG and the output signal Vout received from the node NDO. The exemplary output control circuit 113 includes a PMOS transistor 71 and an inverter 72. While the first program control signal PROG is being disabled, the PMOS transistor 71 makes the inverter 72 output the comparison result signal DIFF at a low level at all times. The source of the PMOS transistor 71 is connected to the internal voltage VCC, and the first program control signal PROG is input to the gate of the PMOS transistor 71. Also, the drain of the PMOS transistor 71 is connected to the node NDO. The inverter 72 inverts the output signal Vout received from the node NDO and outputs an inverted output signal/Vout as the comparison result signal DIFF.

The operation of the program control circuit 100 will be described further below with reference to FIGS. 4 and 5. First, referring to FIG. 4, in order to perform a programming operation on the memory cell C10, the first program control signal PROG and the second program control signal DIN are enabled. Here, the first program control signal PROG is enabled high and the second program control signal DIN is enabled low.

The comparing portion 110 of the level sensing control portion 101 is enabled in response to the first program control signal PROG. To be more specific, referring to FIG. 5, the first program control signal PROG of a high level is inverted by the inverter 51 of the enable control circuit 111. As a result, the inverted first program control signal/PROG is low and is applied to the gates of the PMOS transistor 52 and the NMOS transistor 53 of the enable control circuit 111. Also, the inverted first program control signal/PROG is applied to the gate of the PMOS transistor 61 of the differential amplifier 112. In response to the inverted first program control signal/PROG, the PMOS transistors 52 and 61 are turned on and the NMOS transistor 53 will be turned off.

The voltage Vc output from the node NDC by the PMOS transistors 52 and 61 will be high. In response to the high voltage Vc, the NMOS transistor 66 of the differential amplifier 112 is turned on. The NMOS transistors 64 and 65 of the differential amplifier 112 will compare the reference voltage VREF with the voltage VBL of the bit line BLO and output the output signal Vout corresponding to the result of the comparison to the node NDO.

When the voltage VBL is higher than the reference voltage VREF, the output signal Vout from the differential amplifier 112 will be low. Because the first program control signal PROG is high, the PMOS transistor 71 of the output control circuit 113 will be turned off. The inverter 72 of the output control circuit 113 will invert the output signal Vout and output the comparison result signal DIFF at a high level.

Referring to FIG. 4, the NAND gate 122 of the logic circuit 120 will output a low logic signal LS in response to a high comparison result signal DIFF and a high first program control signal PROG. Also, the inverter 121 of the logic circuit 120 will invert the low second program control signal DIN and output a high inverted second program control signal/DIN. The NAND gate 123 of the logic circuit 120 will output a high voltage control signal CTL in response to the high inverted second program control signal/DIN and the low logic signal LS.

In response to the voltage control signal CTL, the first switching control portion 102 outputs the first high voltage VHM as the first switching bias signal Vswb1. In response to the first switching bias signal Vswb1, the NMOS transistor 103 as the first switching circuit will be turned on.

Meanwhile, the inverter 104 inverts the low second program control signal DIN and outputs a high inverted second program control signal/DIN. In response to the high inverted second program control signal/DIN, the second switching control portion 105 will output the second high voltage VHN as the second switching bias signal Vswb2. In response to the second switching bias signal Vswb2, the PMOS transistor 131 of the second switching circuit 106 is turned off and the NMOS transistor 132 is turned on. As a result, a current path is formed by the NMOS transistors 103 and 132, allowing the program current Ip of the memory cell C10 to flow to the current sink 107 via the NMOS transistors 103 and 132.

Thus, as the programming operation being performed on memory cell C10 progresses, the program current Ip may be reduced and the voltage VBL of the bit line BL0 may also be decreased, thereby reducing the likelihood of over-programming and punch through.

Conversely, when the voltage VBL is lower than the reference voltage VREF, the differential amplifier 112 outputs a high output signal Vout. The inverter 72 of the output control circuit 113 inverts the high output signal Vout and outputs a low comparison result signal DIFF. The NAND gate 122 outputs a high logic signal LS in response to the low comparison result signal DIFF and the high first program control signal PROG. The inverter 121 inverts the low second program control signal DIN and outputs a high inverted second program control signal/DIN. The NAND gate 123 outputs a low voltage control signal CTL in response to the high inverted second program control signal /DIN and the high logic signal LS.

In response to the voltage control signal CTL, the first switching control portion 102 outputs a low first switching bias signal Vswb1. In response to the low first switching bias signal Vswb1, the NMOS transistor 103 will be turned off. As a result, the program current Ip of the memory cell C10 will not be allowed to reach the current sink 107, but will, instead, be supplied to the bit line BL0, thereby increasing the voltage VBL of the bit line BL0.

In this manner, during the programming of memory cell C10, the voltage VBL of the bit line BL0 is not allowed to reach 0V, but is controlled within a predetermined range by the program control circuit 100. The operating conditions for the NMOS transistor 103 in light of the states of signals PROG, DIN, CTL and the comparison of the VBL and VREF voltages are described in TABLE 1.

TABLE 1

| First Program Control Signal (PROG) Level | Second Program Control Signal (DIN) Level | Voltage Control Signal (CTL) Level | Relative Values of Bit Line (VBL) and Reference (VREF) Voltages | Switching Circuit (NMOS 103) State |
|---|---|---|---|---|
| HIGH | HIGH | HIGH | — | ON |
| LOW | HIGH | HIGH | — | ON |
| HIGH | LOW | HIGH | VBL > VREF | ON |
| HIGH | LOW | LOW | VBL < VREF | OFF |
| LOW | LOW | LOW | — | OFF |

As described above, because the program control circuit 100 allows the voltage VBL of the bit line BL0 to be controlled within a predetermined range, the invention makes it possible to reduce or to prevent punch through from occurring in memory cells such as C00 adjacent to the memory cell being programmed such as C01. Also, because the voltage VBL of the bit line BL0 is maintained at a level above 0V, the invention makes it possible to reduce or to prevent over-programming of the memory cells such as C10 being programmed.

The exemplary program control circuit for flash memory devices and the exemplary method for operating such a control circuit according to the present invention will tend to reduce or to prevent punch through from occurring in an adjacent memory cell(s) that share a common source line with a memory cell being programmed and tend to reduce or prevent the memory cell being programmed from being over-programmed.

While the present invention has been particularly shown and described with reference to exemplary embodiments thereof, it will be understood by those of ordinary skill in the art that various changes in form, circuitry, voltages and other details may be made therein without departing from the spirit and scope of the invention as defined by the appended claims and their equivalents.

What is claimed is:

1. A program control circuit for controlling the programming of a memory cell within a flash memory device, the flash memory device including an array of memory cells wherein each memory cell is connected to a word line, a bit line, and a source line and may be programmed by supplying a program current to a corresponding bit line, the program control circuit comprising:
    a level sensing control portion that is selectively enabled or disabled in response to a first program control signal, that, when enabled, outputs a voltage control signal reflecting a comparison of a bit line voltage applied to the memory cell and a reference voltage;
    a switching control portion that outputs a switching bias signal in response to the voltage control signal and a second program control signal;
    a current sink that provides a predetermined current to a ground voltage in response to a reference bias signal; and
    a switching circuit connected between the bit line and the current sink, the switching circuit being selectively enabled or disabled in response to the switching bias signal.

2. The program control circuit according to claim 1, wherein:
    the first program control signal selectively enables or disables a programming operation within the flash memory device is enabled; and
    the second program control signal selectively enables or disables a programming operation for the memory cell.

3. The program control circuit according to claim 1, wherein:
    the level sensing control portion includes;
    a comparing portion in which the bit line voltage is compared with the reference voltage to generate a comparison result signal; and
    a logic circuit that outputs the voltage control signal in response to the comparison result signal and the second program control signal.

4. The program control circuit according to claim 3, wherein:
    the comparing portion includes;

a differential amplifier that compares the bit line voltage with the reference voltage and generates a corresponding internal signal;
    an enable control circuit that selectively enables or disables the differential amplifier in response to the first program control signal; and
    an output control circuit that receives the internal signal when the first program control signal is enabled and outputs the comparison result signal.

5. The program control circuit according to claim 4, wherein:
    the internal signal is set to a first level when the bit line voltage is higher than the reference voltage and the internal signal is set to a second level when the bit line voltage is lower than the reference voltage; and
    the comparison result signal is set to a first level when the internal signal is at the first level and the comparison result signal is set to a second level when the internal signal is at the second level or when the first program control signal is disabled.

6. The program control circuit according to claim 5, wherein:
    the voltage control signal is set to a first level when the comparison result signal is set to the first level and the second program control signal is enabled; and
    the voltage control signal is set to a second level when the comparison result signal is set to the second level and the second program control signal is enabled.

7. The program control circuit according to claim 6, wherein:
    the switching control portion includes:
    a first switching control portion, which outputs a first switching bias signal set to a first level when the voltage control signal is set to the first level and outputs the first switching bias signal set to a second level when the voltage control signal is set to the second level; and
    a second switching control portion, which outputs a second switching bias signal in response to the second program control signal.

8. The program control circuit according to claim 7, wherein:
    the switching circuit includes:
    a first switching circuit connected to the bit line, wherein the first switching circuit is turned on when the first switching bias signal is set to the first level and is turned off when the first switching bias signal is set to the second level; and
    a second switching circuit connected between the first switching circuit and the current sink, wherein the second switching circuit is selectively turned on or off in response to the second switching bias signal.

9. A method of controlling the programming of a memory cell within a flash memory device, the flash memory device including an array of memory cells wherein each memory cell is connected to a word line, a bit line, and a source line and may be programmed by supplying a program current to a corresponding bit line, the method comprising:
    (a) enabling a program control signal to begin programming the memory cell;
    (b) turning on a switching circuit in response to the program control signal, the switching circuit being connected to the corresponding bit line;
    (c) generating a voltage control signal in response to the program control signal and a voltage of the bit line;
    (d) controlling the voltage level of the bit line by turning the switching circuit on or off in response to the voltage control signal; and (e) disabling the program control signal to stop programming the memory cell.

10. The method of controlling the programming of a memory cell according to claim 9, wherein step (c) includes:
(c1) comparing the voltage of the bit line with a reference voltage when the program control signal is enabled and outputting a comparison result signal of a predetermined level based on the result of the comparison; and
(c2) outputting the voltage control signal in response to the comparison result signal.

11. The method of controlling the programming of a memory cell according to claim 10, wherein step (c1) includes:
(c11) outputting the comparison result signal set to a first level when the voltage of the bit line is higher than the reference voltage; and
(c12) outputting the comparison result signal set to a second level when the voltage of the bit line is lower than the reference voltage, and wherein step (c2) includes:
(c21) outputting the voltage control signal set to a first level when the comparison result signal is set to the first level; and
(c22) outputting the voltage control signal set to a second level when the comparison result signal is set to the second level.

12. The method of controlling the programming of a memory cell according to claim 11, wherein step (d) includes:
(d1) turning on the switching circuit when the voltage control signal is set to the first level and thereby reducing the voltage of the bit line; and
(d2) turning off the switching circuit when the voltage control signal is set to the second level and thereby increasing the voltage of the bit line.

13. A method of controlling the bit line voltage during the programming of a memory cell using a program control circuit according to claim 11, the method comprising:
(a) initiating a programming operation whereby a variable bit line voltage is applied to the bit line and the bit line is connected to a current sink;
(b) comparing the applied bit line voltage to a reference voltage wherein the applied bit line voltage decreases as the programming operation continues;
(c) continuing the programming operation to continue while the applied bit line voltage remains greater than the reference voltage;
(d) interrupting the connection between the bit line and the current sink when the applied bit line voltage decreases below the reference voltage.

14. A method of controlling the bit line voltage during the programming of a memory cell, the memory cell according to claim 13, wherein:
the programming operation is initiated by enabling the first program control signal at a high level and enabling the second program control signal at a low level;
the programming operation is continued by maintaining the voltage control signal at a high level while the applied bit line voltage is greater than the reference voltage, thereby allowing the program current to flow to the current sink; the programming operation is continued by changing the voltage control signal to a low level when the applied bit line voltage decreases below the reference voltage, thereby preventing current flow to the current sink and maintaining the applied bit line voltage above 0V; and
the programming operation is terminated by disabling the first program control signal at a low level and disabling the second program control signal at a high level.

15. A control circuit for controlling the programming of a memory cell within a flash memory device, the flash memory device including an array of memory cells wherein each memory cell is connected to a word line, a bit line, and a source line and may be programmed by supplying a program current to a corresponding bit line, the control circuit comprising:
(a) a first circuit for enabling a program control signal to initiate programming of the memory cell;
(b) a second circuit for turning on a switching circuit in response to the program control signal, the switching circuit being connected to the corresponding bit line;
(c) a third circuit for generating a voltage control signal in response to the program control signal, a voltage applied to the bit line and a reference voltage;
(d) a fourth circuit for controlling the voltage level of the bit line by selectively activating or deactivating the switching circuit in response to the voltage control signal; and
(e) a fifth circuit for disabling the program control signal to stop programming the memory cell.

* * * * *